United States Patent
Jang et al.

(10) Patent No.: US 12,134,821 B2
(45) Date of Patent: Nov. 5, 2024

(54) MULTILAYER ENCAPSULATION THIN-FILM

(71) Applicants: Research & Business Foundation Sungkyunkwan University, Suwon-si (KR); Samsung Display Co., Ltd., Yongin-si (KR)

(72) Inventors: Choelmin Jang, Yongin-si (KR); Sungmin Cho, Gunpo-si (KR); Ho Kyoon Chung, Yongin-si (KR); Heeyeop Chae, Anyang-si (KR); Sang Joon Seo, Seoul (KR); Seung Woo Seo, Hwaseong-si (KR)

(73) Assignees: Research & Business Foundation Sungkyunkwan University, Suwon-si (KR); Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 17/491,554

(22) Filed: Oct. 1, 2021

(65) Prior Publication Data
US 2022/0018022 A1    Jan. 20, 2022

Related U.S. Application Data

(62) Division of application No. 16/654,096, filed on Oct. 16, 2019, now abandoned, which is a division of
(Continued)

(30) Foreign Application Priority Data

Apr. 30, 2013 (KR) .................. 10-2013-0047933
Feb. 11, 2014 (KR) .................. 10-2014-0015730

(51) Int. Cl.
*C23C 16/44* (2006.01)
*C23C 16/455* (2006.01)
(Continued)

(52) U.S. Cl.
CPC ........ *C23C 16/44* (2013.01); *C23C 16/45519* (2013.01); *C23C 16/45548* (2013.01);
(Continued)

(58) Field of Classification Search
None
See application file for complete search history.

(56) References Cited

U.S. PATENT DOCUMENTS 5,260,095 A * 11/1993 Affinito .................. B05D 5/068
427/124
6,450,025 B1   9/2002 Wado et al.
(Continued)

FOREIGN PATENT DOCUMENTS

CN       1543514 A    11/2004
CN     101228217 A     7/2008
(Continued)

OTHER PUBLICATIONS

JP2007-090803English machine translation (2007).*
(Continued)

*Primary Examiner* — Kenneth J Stachel
(74) *Attorney, Agent, or Firm* — NSIP Law

(57) ABSTRACT

A multilayer encapsulation thin-film and a method and apparatus for preparing a multilayer encapsulation thin-film are provided. The multilayer encapsulation thin-film includes an inorganic thin film that includes a metal oxide, and an organic thin film that includes a polymer and is formed on the inorganic thin film, where the inorganic thin film and the organic thin film are alternately stacked in multiple layers.

7 Claims, 19 Drawing Sheets

Related U.S. Application Data application No. 14/260,815, filed on Apr. 24, 2014, now abandoned.

(51) Int. Cl.

| | | |
|---|---|---|
| *C23C 16/54* | (2006.01) | |
| *C23C 28/00* | (2006.01) | |
| *H10K 30/88* | (2023.01) | |
| *H10K 50/844* | (2023.01) | |

(52) U.S. Cl.

CPC .............. *C23C 16/54* (2013.01); *C23C 28/00* (2013.01); *C23C 28/42* (2013.01); *H10K 30/88* (2023.02); *H10K 50/8445* (2023.02); *Y02E 10/549* (2013.01); *Y10T 428/269* (2015.01); *Y10T 428/31663* (2015.04); *Y10T 428/31855* (2015.04); *Y10T 428/31935* (2015.04)

(56) References Cited

U.S. PATENT DOCUMENTS

| 2004/0018305 | A1* | 1/2004 | Pagano | C23C 16/54 |
|---|---|---|---|---|
| | | | | 427/404 |
| 2004/0195960 | A1 | 10/2004 | Czeremuszkin et al. | |
| 2007/0228470 | A1 | 10/2007 | Levy | |
| 2008/0260963 | A1 | 10/2008 | Yoon et al. | |
| 2009/0081886 | A1 | 3/2009 | Levy et al. | |
| 2009/0202743 | A1 | 8/2009 | Schaepkens et al. | |
| 2009/0324971 | A1 | 12/2009 | De Vries et al. | |
| 2010/0117522 | A1 | 5/2010 | Park et al. | |
| 2010/0143710 | A1 | 6/2010 | Dickey et al. | |
| 2010/0178481 | A1 | 7/2010 | George et al. | |
| 2012/0003448 | A1 | 1/2012 | Weigel et al. | |
| 2012/0034451 | A1 | 2/2012 | Seo et al. | |
| 2012/0225219 | A1* | 9/2012 | Yudovsky | C23C 16/45551 |
| | | | | 118/724 |
| 2013/0108778 | A1 | 5/2013 | Seo et al. | |
| 2014/0044889 | A1 | 2/2014 | Qi et al. | |

FOREIGN PATENT DOCUMENTS

| CN | 101295768 | A | | 10/2008 |
|---|---|---|---|---|
| CN | 201616434 | U | | 10/2010 |
| CN | 102214803 | A | | 10/2011 |
| CN | 102362369 | A | | 2/2012 |
| CN | 103430345 | A | | 12/2013 |
| JP | 2007-90803 | A | | 4/2007 |
| JP | 2007090803 | A | * | 4/2007 |
| KR | 10-2010-0053970 | A | | 5/2010 |
| KR | 10-2011-0049477 | A | | 5/2011 |
| KR | 10-2012-0001778 | A | | 1/2012 |
| WO | WO 2010/108894 | A1 | | 9/2010 |

OTHER PUBLICATIONS

Park, Sang-Hee Ko, et al., "Ultra-Thin Film Encapsulation of Organic Light Emitting Diode on a Plastic Substrate", *ETRI Journal*, Oct. 2005, vol. 27, No. 5, pp. 545-550 (6 pages in English).

Illiberi et al., "Spatial Atomic Layer Deposition of Zinc Oxide Thin Films," 2011 American Chemical Society, ACS Applied Materials & Interfaces, 4(1), 2012, pp. 268-272.

Poodt et al., "High-Speed Spatial Atomic-Layer Deposition of Aluminum Oxide Layers for Solar Cell Passivation," Advanced Materials, 22(32), 2010, pp. 3564-3567.

Werner et al., "Very low surface recombination velocities on p- and n-type c-Si by ultrafast spatial atomic layer deposition of aluminum oxide," Applied Physics Letters, 97(16), 2010, 162103, 3 pages.

Seo, Seung-Woo, et al. "Extremely bendable thin-film encapsulation of organic light-emitting diodes." Applied Physics Letters 102.16, 2013, (5 pages in English).

* cited by examiner

MULTILAYER ENCAPSULATION THIN-FILM

CROSS-REFERENCE TO RELATED APPLICATIONS

This is a divisional application of U.S. application Ser. No. 16/654,096 filed on Oct. 16, 2019, which is a divisional application of U.S. application Ser. No. 14/260,815 filed on Apr. 24, 2014 which claims the benefit under 35 USC 119(a) to Korean Patent Application No. 10-2014-0015730 filed on Feb. 11, 2014 and Korean Patent Application No. 10-2013-0047933 filed on Apr. 30, 2013, in the Korean Intellectual Property Office, the disclosures of which are incorporated herein by reference for all purposes.

BACKGROUND

1. Field

The following description relates to a multilayer encapsulation thin-film and a method and apparatus for preparing the multilayer encapsulation thin-film.

2. Description of Related Art

An organic device such as an organic light emitting diode (OLED), an organic photovoltaic cell (OPV cell), and the like contains an organic material and a metallic electrode which is easily oxidized and has a low work function in order to facilitate charge transfer with the organic material. Thus, it is very vulnerable to oxidative materials such as water vapor or oxygen. Therefore, if it is exposed to oxygen or steam, power reduction or early deterioration of performance may occur. In order to prevent deterioration, it is necessary to use an encapsulation method capable of completely blocking an organic device from water vapor or oxygen.

Currently, most organic devices are produced on a glass substrate, and for complete encapsulation of these devices, an encapsulation method of covering at an upper unit of an organic device with a glass or metal can has been used. Here, the glass or metal can is bonded using glass frit or an UV-curing polymer, so that the organic device can be completely separated from external water vapor or oxygen. After encapsulation, in order to remove water vapor and oxygen which may remain on the upper unit of the organic device, a desiccant may be used within the glass or metal can.

Since organic devices have flexibility due to the nature of an organic material, attempts to make the most of this property have been made. In order to do so, the organic devices need to be produced using a substrate made of plastic, metal foil, or flexible glass, and an encapsulation material also needs to be flexible. Particularly, in the case of a flexible organic device using a substrate made of plastic, a process temperature is limited. Thus, an encapsulation method needs to be performed through a low-temperature process. An encapsulation thin film method has been developed for this purpose. The encapsulation thin film method is a method of blocking an organic device from water vapor or oxygen by directly depositing an inorganic thin film or an organic thin film on a surface of the organic device and does not require a sealant for edge sealing or an absorbent/desiccant, and, thus, a thin device can be produced by this method.

Recently, there have been made attempts to utilize a multilayer organic-inorganic hybrid thin film by stacking an inorganic material and an organic material in multiple layers. As an inorganic material used for such a multilayer organic-inorganic thin film, a metal oxide such as an aluminum oxide has been used. Further, as an organic material, an acrylic polymer polymerized by spray-coating an acrylic monomer followed by UV-curing has been used. Korean Patent No. 10-2011-0049477 relates to a multilayer thin film for encapsulation and a preparing method thereof, and describes a multilayer encapsulation film including a protective layer made of an aluminum oxide, single or double blocking layers made of silicon nitride, and a mechanical protective layer formed of silicon dioxide stacked in sequence. However, in such multilayer encapsulation film, when the protective layer and the blocking layer are formed, thin films are formed by atomic layer deposition (ALD) and chemical vapor deposition (CVD), respectively, and then, a silicon oxide solution in a sol-gel state is discharged by a spraying method to form the mechanical protective layer. Since deposition of the thin films are carried out in separate apparatuses, consecutive transfer needs to be made and it takes a significant amount of time to deposit the thin films. Therefore, such a method has limitation in that the overall processing time is increased.

In order to avoid the complexity, when a multilayer encapsulation thin-film is formed, there has been demanded development of a process that is simplified and requires a reduced overall processing time.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a multilayer encapsulation thin-film comprising: an inorganic thin film that comprises a metal oxide; and an organic thin film that comprises a polymer and is formed on the inorganic thin film, wherein the inorganic thin film and the organic thin film are alternately stacked in multiple layers.

In another general aspect, there is provided a multilayer encapsulation thin-film wherein the metal oxide comprises a member selected from the group consisting of aluminum oxide, zirconium oxide, zinc oxide, silicon oxide, silicon nitride, silicon carbide, silicon oxynitride, silicon oxycarbide, and combinations thereof.

In another general aspect, there is provided a multilayer encapsulation thin-film wherein the polymer comprises a member selected from the group consisting of a plasma polymer, an acrylic polymer, and combinations thereof.

In another general aspect, there is provided a multilayer encapsulation thin-film wherein the plasma polymer comprises a member selected from the group consisting of hexamethyl disiloxane, furan, hexane and combinations thereof.

In another general aspect, there is provided a multilayer encapsulation thin-film wherein the acrylic polymer comprises a member selected from the group consisting of an acrylate, a urethane acrylate, a polyacrylate, a polyalkylacrylate, a polyacrylamide, an ethylene-acrylic acid copolymer, and combinations thereof.

In another general aspect, there is provided a multilayer encapsulation thin-film wherein a single layer of the inorganic thin film has a thickness in a range of from 0.1 nm to 20 nm.

In another general aspect, there is provided a multilayer encapsulation thin-film wherein a single layer of the organic thin film has a thickness in a range of from 20 nm to 2 µm.

In another general aspect, there is provided a multilayer encapsulation thin-film wherein the multiple layers comprise 2 to 200 dyads of the inorganic thin film and the organic thin film.

In yet another general aspect, there is provided a method of preparing a multilayer encapsulation thin-film, the method comprising: forming an inorganic thin film comprising a metal oxide on a substrate; and forming an organic thin film comprising a polymer on the inorganic thin film, wherein the forming the inorganic thin film on the substrate and the forming the organic thin film comprising the polymer on the inorganic thin film are alternately carried out, so that the inorganic thin film and the organic thin film are alternately stacked.

In another general aspect, there is provided a method of preparing a multilayer encapsulation thin-film wherein the forming of the inorganic thin film is carried out by atomic layer deposition.

In another general aspect, there is provided a method of preparing a multilayer encapsulation thin-film wherein the forming of the organic thin film is carried out by chemical vapor deposition or atomic layer deposition.

In another general aspect, there is provided a method of preparing a multilayer encapsulation thin-film wherein the forming of the organic thin film is carried out by coating an acrylic monomer on the inorganic thin film and then UV-curing the coating.

In another general aspect, there is provided a method of preparing a multilayer encapsulation thin-film wherein the forming of the inorganic thin film and/or the forming of the organic thin film are carried out at a temperature in a range of about 20° C. to about 120° C.

In another general aspect, there is provided a method of preparing a multilayer encapsulation thin-film wherein the atomic layer deposition comprises spatially arranging raw materials for the inorganic thin film on a moving substrate.

In yet another general aspect, there is provided an apparatus for producing a multilayer encapsulation thin-film comprising: a substrate loading unit on which a substrate is loaded; an inorganic thin film deposition unit to deposit an inorganic thin film on the substrate; and an organic thin film deposition unit to deposit an organic thin film on the inorganic thin film, wherein the inorganic thin film deposition unit and the organic thin film deposition unit are sequentially connected to each other, and the substrate loading unit is alternately moved to the inorganic thin film deposition unit and the organic thin film deposition unit, so that the inorganic thin film and the organic thin film are alternately deposited on the substrate.

In another general aspect, there is provided an apparatus for producing a multilayer encapsulation thin-film, wherein the organic thin film deposition unit further comprises a UV curing unit.

In another general aspect, there is provided an apparatus for producing a multilayer encapsulation thin-film wherein a plurality of inorganic thin film deposition units are sequentially connected to the organic thin film deposition unit through more than one connection.

In another general aspect, there is provided an apparatus for producing a multilayer encapsulation thin-film wherein the plurality of inorganic thin film deposition units and the organic thin film deposition unit are alternately arranged.

In another general aspect, there is provided an apparatus for producing a multilayer encapsulation thin-film wherein the organic thin film deposition unit is arranged at a terminus of the sequential connection of units.

Other features and aspects will be apparent from the following detailed description, the drawings, and the claims.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

Figure 1A:
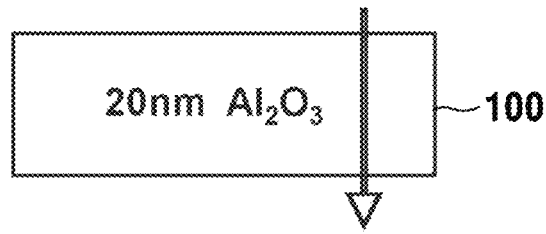
FIG. 1A is a diagram that illustrates an example of an inorganic thin film.
Figure 1B:
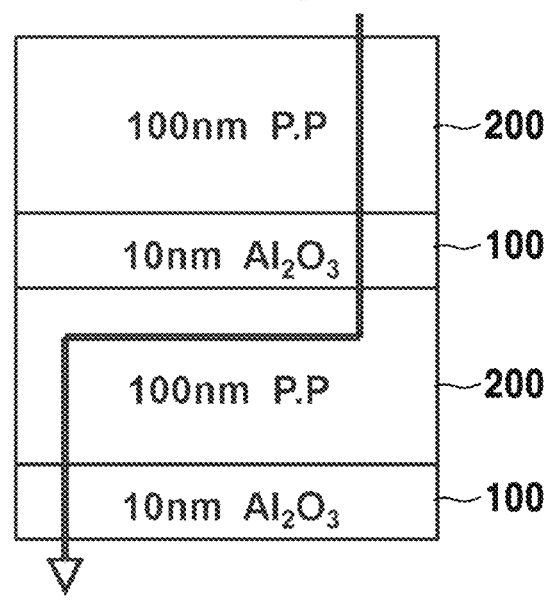
FIG. 1B to FIG. 1F are diagrams that illustrate an example of ultra-flexible multilayer encapsulation thin-films including inorganic thin films and organic thin films stacked alternately.
Figure 1C:
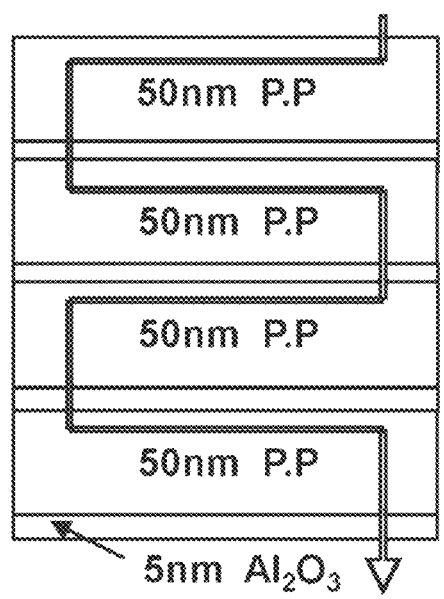
Figure 1D:
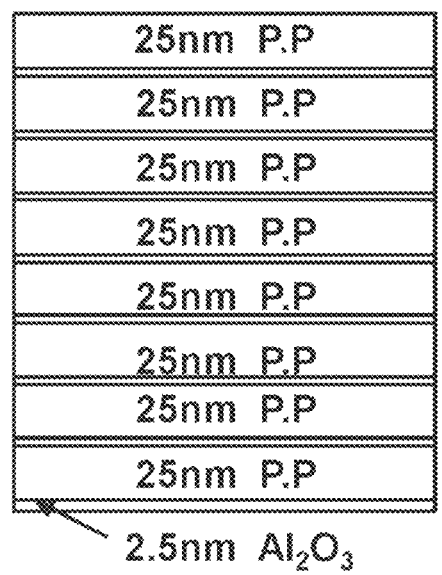
Figure 1E:
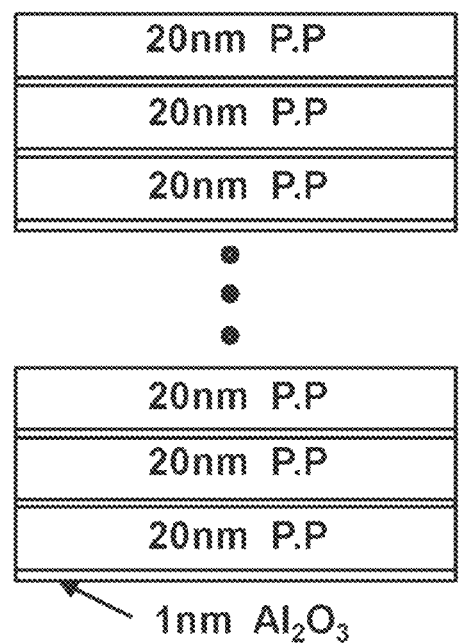
Figure 1F:
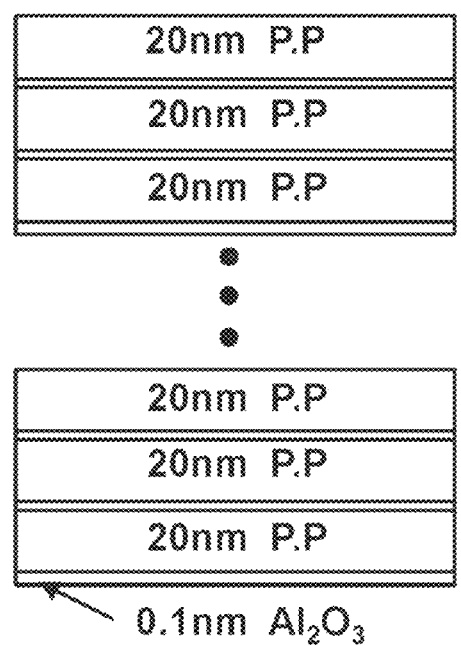

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document of the present disclosure, the term "connected to" or "coupled to" that is used to designate a connection or coupling of one element to another element includes both a case that an element is "directly connected or coupled to" another element and a case that an element is "electronically connected or coupled to" another element via still another element.

Through the whole document of the present disclosure, the term "on" that is used to designate a position of one element with respect to another element includes both a case that the one element is adjacent to the another element and a case that any other element exists between these two elements.

Through the whole document of the present disclosure, the term "comprises or includes" and/or "comprising or including" used in the document means that one or more other components, steps, operation and/or existence or addition of elements are not excluded in addition to the described components, steps, operation and/or elements unless context dictates otherwise. Through the whole document of the present disclosure, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document of the present disclosure, the term "step of" does not mean "step for".

Through the whole document of the present disclosure, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document of the present disclosure, a phrase in the form "A and/or B" means "A, B, or A and B".

Through the whole document of the present disclosure, the term "plasma polymer" refers to a polymer formed through conversion of a monomolecular organic material into highly reactive radicals in plasma and radical-polymerization on a surface of a substrate.

Hereinafter, illustrative descriptions and examples of the present disclosure will be explained in detail with reference to the accompanying drawings. However, the present disclosure may not be limited to the illustrative descriptions, examples, and drawings.

In view of the limitations described in the Description of Related Art, the present disclosure provides an ultra-flexible encapsulation thin-film and a method and apparatus for preparing the ultra-flexible multilayer encapsulation thin-film.

However, limitations to be overcome by the present disclosure are not limited to the above-described limitations. Although not described herein, other limitations to be overcome by the present disclosure can be clearly understood by those skilled in the art from the following description.

In the multilayer encapsulation thin-film in accordance with the present disclosure, inorganic materials are divided into multiple layers, so that a thickness of each inorganic thin film can be reduced. Therefore, fragility of the inorganic material can be reduced and flexibility of the entire thin film can be improved. Further, the organic thin films interposed between the inorganic thin films may be more elastic than the inorganic thin films and thus may offer an effect of improving a bending property of the entire thin film.

Furthermore, even if water vapor or oxygen permeates through cracks present in certain inorganic thin films, a path allowing water vapor or oxygen can be lengthened. Therefore, it is possible to greatly increase an effect of suppressing transmission of water vapor.

The apparatus for preparing the ultra-flexible multilayer encapsulation thin-film in accordance with the present disclosure deposits the inorganic material and the organic material in the same apparatus, and, thus, when an ultra-flexible encapsulation thin-film is prepared, a processing time can be reduced.

The foregoing summary is illustrative only and is not intended to be in any way limiting. In addition to the illustrative aspects, embodiments, and features described above, further aspects, embodiments, and features will become apparent by reference to the drawings and the following detailed description.

In one general aspect of the present disclosure, an ultra-flexible multilayer encapsulation thin-film comprises an inorganic thin film which contains a metal oxide and is formed on a substrate, and an organic thin film which contains a polymer and is formed on the inorganic thin film. The inorganic thin film and the organic thin film are alternately stacked on each other in multiple layers.

As depicted in FIG. 1, a multilayer encapsulation thin-film in accordance with the present disclosure may be formed by stacking an inorganic thin film 100 (e.g., $Al_2O_3$) and an organic thin film 200 (e.g., plasma polymer [P.P]) in sequence, but may not be limited thereto. By way of example, the number of dyads of the multilayer encapsulation thin-film may be in a range of, but not limited to, from about 2 dyads to about 200 dyads. By way of example, the number of dyads of the multilayer encapsulation thin-film may be in a range of, but not limited to, from about 2 dyads to about 200 dyads, from about 4 dyads to about 200 dyads, from about 8 dyads to about 200 dyads, from about 10 dyads to about 200 dyads, from about 20 dyads to about 200 dyads, from about 50 dyads to about 200 dyads, from about 70 dyads to about 200 dyads, from about 100 dyads to about 200 dyads, from about 130 dyads to about 200 dyads, from about 150 dyads to about 200 dyads, from about 180 dyads to about 200 dyads, from about 2 dyads to about 180 dyads, from about 4 dyads to about 180 dyads, from about 8 dyads to about 180 dyads, from about 10 dyads to about 180 dyads, from about 20 dyads to about 180 dyads, from about 50 dyads to about 180 dyads, from about 70 dyads to about 180 dyads, from about 100 dyads to about 180 dyads, from about 130 dyads to about 180 dyads, from about 150 dyads to about 180 dyads, from about 2 dyads to about 150 dyads, from about 4 dyads to about 150 dyads, from about 8 dyads to about 150 dyads, from about 10 dyads to about 150 dyads, from about 20 dyads to about 150 dyads, from about 50 dyads to about 150 dyads, from about 70 dyads to about 150 dyads, from about 100 dyads to about 150 dyads, from about 130 dyads to about 150 dyads, from about 2 dyads to about 130 dyads, from about 4 dyads to about 130 dyads, from about 8 dyads to about 130 dyads, from about 10 dyads to about 130 dyads, from about 20 dyads to about 130 dyads, from about 50 dyads to about 130 dyads, from about 70 dyads to about 130 dyads, from about 100 dyads to about 130 dyads, from about 2 dyads to about 100 dyads, from about 4 dyads to about 100 dyads, from about 8 dyads to about 100 dyads, from about 10 dyads to about 100 dyads, from about 20 dyads to about 100 dyads, from about 50 dyads to about 100 dyads, from about 70 dyads to about 100 dyads, from about 2 dyads to about 70 dyads, from about 4 dyads to about 70 dyads, from about 8 dyads to about 70 dyads, from about 10 dyads to about 70 dyads, from about 20 dyads to about 70 dyads, from about 50 dyads to about 70 dyads, from about 2 dyads to about 50 dyads, from about 4 dyads to about 50 dyads, from about 8 dyads to about 50 dyads, from about 10 dyads to about 50 dyads, from about 20 dyads to about 50 dyads, from about 2 dyads to about 20 dyads, from about 4 dyads to about 20 dyads, from about 8 dyads to about 20 dyads, from about 10 dyads to about 20 dyads, from about 2 dyads to about 10 dyads, from about 4 dyads to about 10 dyads, from about 8 dyads to about 10 dyads, from about 2 dyads to about 8 dyads, from about 4 dyads to about 8 dyads, or from about 2 dyads to about 4 dyads. As the number of dyads of the multilayer encapsulation thin-film is increased, a thickness of each inorganic thin film 100 is reduced and a path (e.g., illustrated by traversing arrows in FIGS. 1A to 1C) allowing water vapor to permeate through cracks of the inorganic thin film 100 is lengthened, and, thus, a property of suppressing transmission of water vapor can be improved. Further, flexibility can be improved due to elasticity of the organic thin film 200.

In accordance with an illustrative description of the present disclosure, the metal oxide may include, but may not be limited to, a member selected from the group consisting of aluminum oxide ($Al_2O_3$), zirconium oxide ($ZrO_2$), zinc oxide, silicon oxide ($SiO_2$), silicon nitride ($Si_3N_4$), silicon carbide (SiC), silicon oxynitride ($Si_2N_2O$), silicon oxycarbide (SiOC), and combinations thereof.

In accordance with an illustrative description of the present disclosure, a single layer of the inorganic thin film may have a thickness in a range of, but not limited to, from about 0.1 nm to about 20 nm. By way of example, the inorganic thin film may have a thickness in a range of, but not limited to, from about 0.1 nm to about 20 nm, from about 1 nm to about 20 nm, from about 2.5 nm to about 20 nm, from about 5 nm to about 20 nm, from about 10 nm to about 20 nm, from about 0.1 nm to about 10 nm, from about 1 nm to about 10 nm, from about 2.5 nm to about 10 nm, from about 5 nm to about 10 nm, from about 0.1 nm to about 5 nm, from about 1 nm to about 5 nm, from about 2.5 nm to about 5 nm, from about 0.1 nm to about 2.5 nm, from about 1 nm to about 2.5 nm, or from about 0.1 nm to about 1 nm.

In accordance with an illustrative description of the present disclosure, the aggregate of all the layers of the inorganic thin films in an encapsulation thin film may have a total thickness in a range of, but not limited to, from about 0.1 nm to about 20 nm. By way of example, the inorganic thin films may have a combined thickness in a range of, but not limited to, from about 0.1 nm to about 20 nm, from about 1 nm to about 20 nm, from about 2.5 nm to about 20 nm, from about 5 nm to about 20 nm, from about 10 nm to about 20 nm, from about 0.1 nm to about 10 nm, from about 1 nm to about 10 nm, from about 2.5 nm to about 10 nm, from about 5 nm to about 10 nm, from about 0.1 nm to about 5 nm, from about 1 nm to about 5 nm, from about 2.5 nm to about 5 nm, from about 0.1 nm to about 2.5 nm, from about 1 nm to about 2.5 nm, or from about 0.1 nm to about 1 nm.

In accordance with an illustrative description of the present disclosure, the polymer may include, but may not be limited to, a member selected from the group consisting of a plasma polymer, an acrylic polymer, and combinations thereof. By way of example, the plasma polymer may include, but may not be limited to, a member selected from the group consisting of hexamethyl disiloxane (hereinafter, referred to as "HMDSO" in some cases), 1,4-epoxy-1,3-butadiene (hereinafter, referred to as "furan" in some cases), hexane, and combinations thereof. By way of example, the acrylic polymer may include, but may not be limited to, a member selected from the group consisting of an acrylate, urethane acrylate, a polyacrylate, a polyalkylacrylate, a polyacrylamide, an ethylene-acrylic acid copolymer, and combinations thereof.

In accordance with an illustrative description of the present disclosure, a single layer of the organic thin film 200 may have a thickness in a range of, but not limited to, from about 20 nm to about 2 μm. By way of example, the organic thin film may have a thickness in a range of, but not limited to, from about 20 nm to about 2 μm, from about 50 nm to about 2 μm, from about 100 nm to about 2 μm, from about 300 nm to about 2 μm, from about 500 nm to about 2 μm, from about 700 nm to about 2 μm, from about 900 nm to about 2 μm, from about 1 μm to about 2 μm, from about 20 nm to about 1 μm, from about 50 nm to about 1 μm, from about 100 nm to about 1 μm, from about 300 nm to about 1 μm, from about 500 nm to about 1 μm, from about 700 nm to about 1 μm, from about 900 nm to about 1 μm, from about 20 nm to about 900 nm, from about 50 nm to about 900 nm, from about 100 nm to about 900 nm, from about 300 nm to about 900 nm, from about 500 nm to about 900 nm, from about 700 nm to about 900 nm, from about 20 nm to about 700 nm, from about 50 nm to about 700 nm, from about 100 nm to about 700 nm, from about 300 nm to about 700 nm, from about 500 nm to about 700 nm, from about 20 nm to about 500 nm, from about 50 nm to about 500 nm, from about 100 nm to about 500 nm, from about 300 nm to about 500 nm, from about 20 nm to about 300 nm, from about 50 nm to about 300 nm, from about 100 nm to about 300 nm, from about 20 nm to about 100 nm, from about 50 nm to about 100 nm, or from about 20 nm to about 50 nm.

If the multilayer encapsulation thin-film in accordance with the present disclosure is positioned at a neutral plane where a tensile force and a compressive force can be counterbalanced by each other, the probability of appearance of cracks due to bending may decrease, but the present disclosure may not be limited thereto. By way of example, if the same material is used for upper and lower parts of a multilayer thin film, the multilayer encapsulation thin-film can be positioned at the neutral plane, but may not be limited thereto. Theoretically, if upper and lower parts are completely symmetric, a tensile force and/or a compressive force are not applied to a neutral plane. Thus, appearance of cracks can also be suppressed. However, in a practical process, complete symmetry cannot be achieved. Thus, a tensile force and/or a compressive force to a certain extent may be generated, but the present disclosure may not be limited thereto.

In another general aspect of the present disclosure, a preparing method of an ultra-flexible multilayer encapsulation thin-film comprises forming an inorganic thin film containing a metal oxide on a substrate, and forming an organic thin film containing a polymer on the inorganic thin film. The forming the inorganic thin film on the substrate and the forming the organic thin film containing the polymer on the inorganic thin film are alternately carried out, so that the inorganic thin film and the organic thin film are alternately stacked on each other. All of the descriptions regarding the previously described general aspect of the present disclosure can be applied to the ultra-flexible multilayer encapsulation thin-film in accordance with the present general aspect.

In accordance with an illustrative description of the present disclosure, the forming of the inorganic thin film may be carried out by atomic layer deposition (ALD). If the inorganic thin film is formed by atomic layer deposition, an inorganic thin film having a small thickness of, but not limited to, about 20 nm or less may be formed. By way of example, the inorganic thin film may have a thickness of, but not limited to, about 20 nm or less, about 18 nm or less, about 16 nm or less, about 14 nm or less, about 12 nm or less, about 10 nm or less, about 8 nm or less, about 6 nm or less, about 4 nm or less, about 2 nm or less, about 1 nm or less, or about 0.5 nm or less.

In accordance with the present disclosure, the forming of the organic thin film may be carried out by chemical vapor deposition or atomic layer deposition. By way of example, if the organic thin film contains a plasma polymer, the organic thin film may be formed through conversion of an organic monomer into radicals in plasma and radical-polymerization, but the present disclosure may not be limited thereto. A monomer used for forming the plasma polymer is not specifically limited. Any organic monomer may be used to deposit the plasma polymer, but the present disclosure may not be limited thereto. By way of example, the monomer may include, but may not be limited to, a member selected from the group consisting of HMDSO (hexamethyl disiloxane), furan (1,4-epoxy-1,3-butadiene), hexane, and combinations thereof. By way of example, if the organic thin film contains an acrylic polymer, the organic thin film may be formed through coating of a monomer and then UV-curing, but the present disclosure may not be limited thereto.

By way of example, the acrylic polymer may include, but may not be limited to, a member selected from the group consisting of an acrylate, urethane acrylate, a polyacrylate, a polyalkylacrylate, a polyacrylamide, an ethylene-acrylic acid copolymer, and combinations thereof. A single layer of the organic thin film in accordance with the present disclosure may have a thickness in a range of, but not limited to, from about 20 nm to about 2 μm depending on a coating thickness of the monomer and/or an intensity of UV rays.

Deposition of the inorganic thin film and/or the organic thin film in accordance with the present disclosure may be carried out at a temperature in a range of, but not limited to, from room temperature (about 20° C.) to about 120° C. By way of example, deposition of the inorganic thin film and/or the organic thin film may be carried out at a temperature in a range of, but not limited to, from room temperature to about 120° C., from about 30° C. to about 120° C., from about 45° C. to about 120° C., from about 60° C. to about 120° C., from about 75° C. to about 120° C., from about 90° C. to about 120° C., from about 105° C. to about 120° C., from room temperature to about 105° C., from about 30° C. to about 105° C., from about 45° C. to about 105° C., from about 60° C. to about 105° C., from about 75° C. to about 105° C., from about 90° C. to about 105° C., from room temperature to about 90° C., from about 30° C. to about 90° C., from about 45° C. to about 90° C., from about 60° C. to about 90° C., from about 75° C. to about 90° C., from room temperature to about 75° C., from about 30° C. to about 75° C., from about 45° C. to about 75° C., from about 60° C. to about 75° C., from room temperature to about 60° C., from about 30° C. to about 60° C., from about 45° C. to about 60° C., from room temperature to about 45° C., from about 30° C. to about 45° C., or from room temperature to about 30° C.

In yet another general aspect of the present disclosure, an apparatus for producing an ultra-flexible multilayer encapsulation thin-film comprises a substrate loading unit on which a substrate is loaded, an inorganic thin film deposition unit to deposit an inorganic thin film on the substrate, and an organic thin film deposition unit to deposit an organic thin film on the inorganic thin film. The inorganic thin film deposition unit and the organic thin film deposition unit are sequentially connected to each other, and the substrate loading unit is alternately moved to the inorganic thin film deposition unit and the organic thin film deposition unit, so that the inorganic thin film and the organic thin film are alternately deposited on each other on the substrate.

Figure 2:
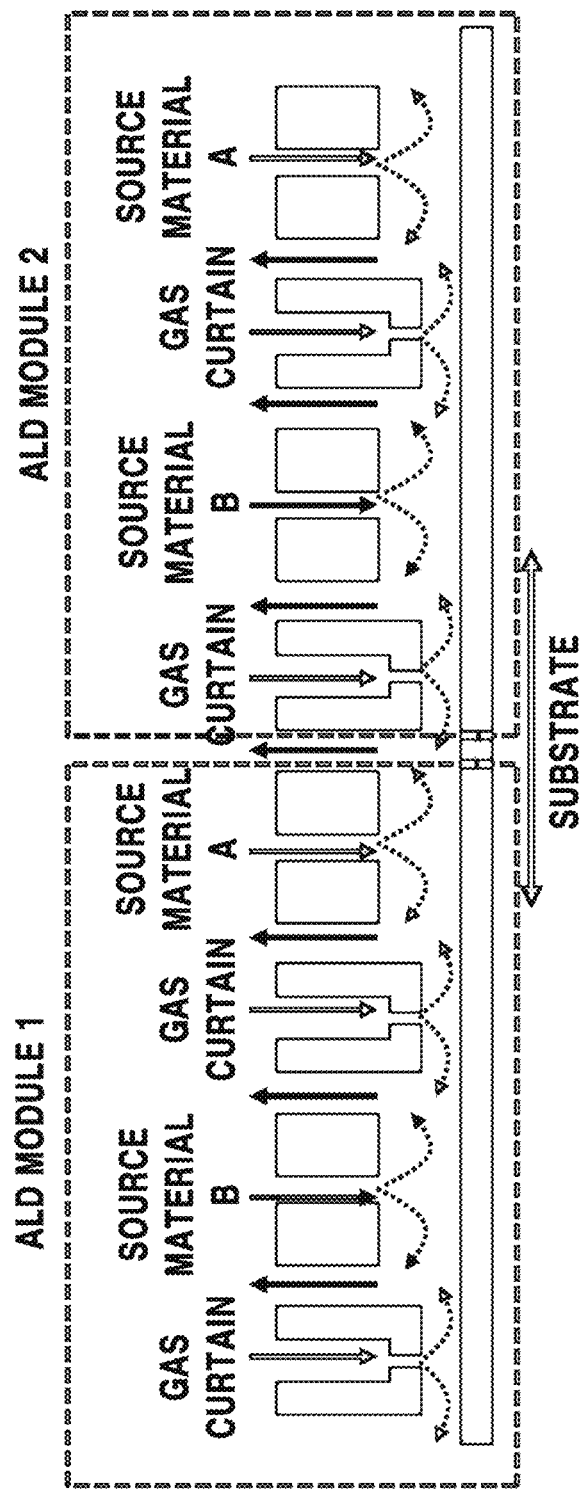
FIG. 2 is a schematic diagram illustrating an example of a spatial atomic layer deposition (ALD) in accordance with the present disclosure.
Figure 3:
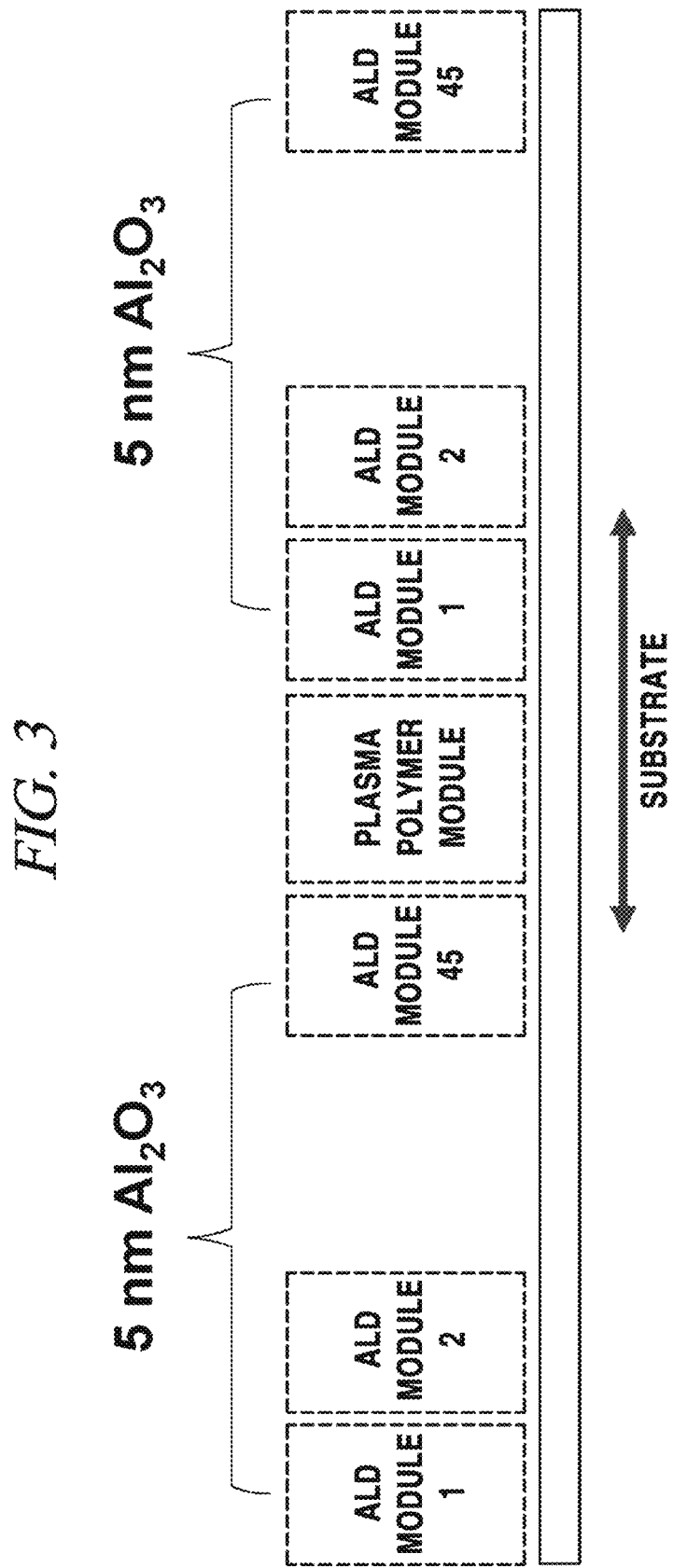
FIG. 3 is a schematic diagram illustrating an example of a device for growing an inorganic thin film of 5 nm and an organic thin film in accordance with the present disclosure.

The inorganic thin film in accordance with the present disclosure is deposited on a substrate by ALD. In order to deposit the inorganic thin film at a high speed, spatial atomic layer deposition (spatial ALD) may be employed instead of temporal atomic layer deposition (temporal ALD) typically used. As depicted in FIG. 2, spatial ALD refers to a method of spatially arranging raw material modules for atomic layers on a moving substrate. A processing time of the spatial ALD may be much shorter than that of the temporal ALD in which the raw materials are repeatedly injected and discharged for a short time. By way of example, if a multilayer encapsulation thin-film including the inorganic thin film having a thickness of about 5 nm is prepared using a spatial atomic layer deposition device, a device schematically illustrated in FIG. 3 may be used. A plasma polymer module may grow a plasma polymer to a desired thickness in a single module depending on a design of the device.

Figure 4:
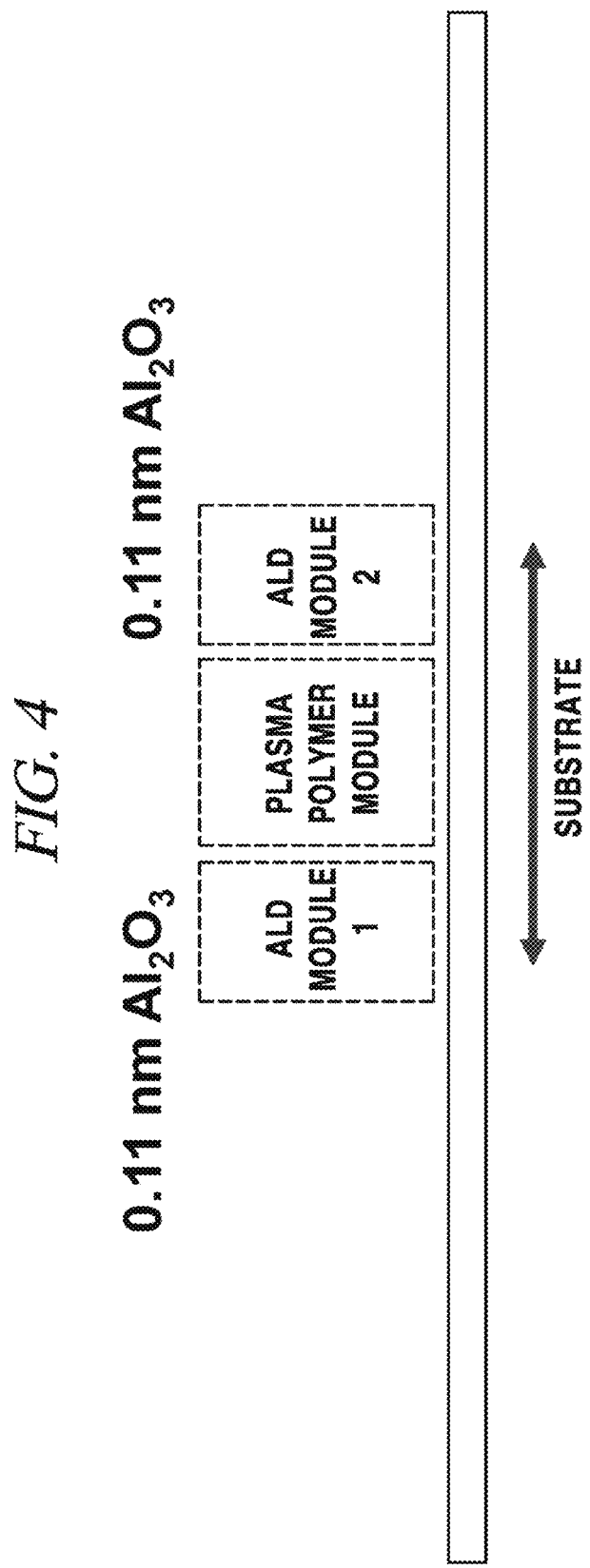
FIG. 4 is a schematic diagram illustrating an example of a device for growing an aluminum oxide thin film of 0.11 nm and a plasma polymer thin film in accordance the present disclosure.

As depicted in FIG. 4, the number of modules required for stacking an aluminum oxide thin film having a thickness of about 0.11 nm (for one cycle) and a plasma polymer thin film in sequence in accordance with an example of the present disclosure can be remarkably reduced, and, thus, a process device can be simplified. Even with such a simplified process device, a multilayer encapsulation thin-film having high flexibility and also satisfying a water vapor transmission rate (WVTR) condition of an organic light emitting diode can be prepared within a short time.

Figure 5:
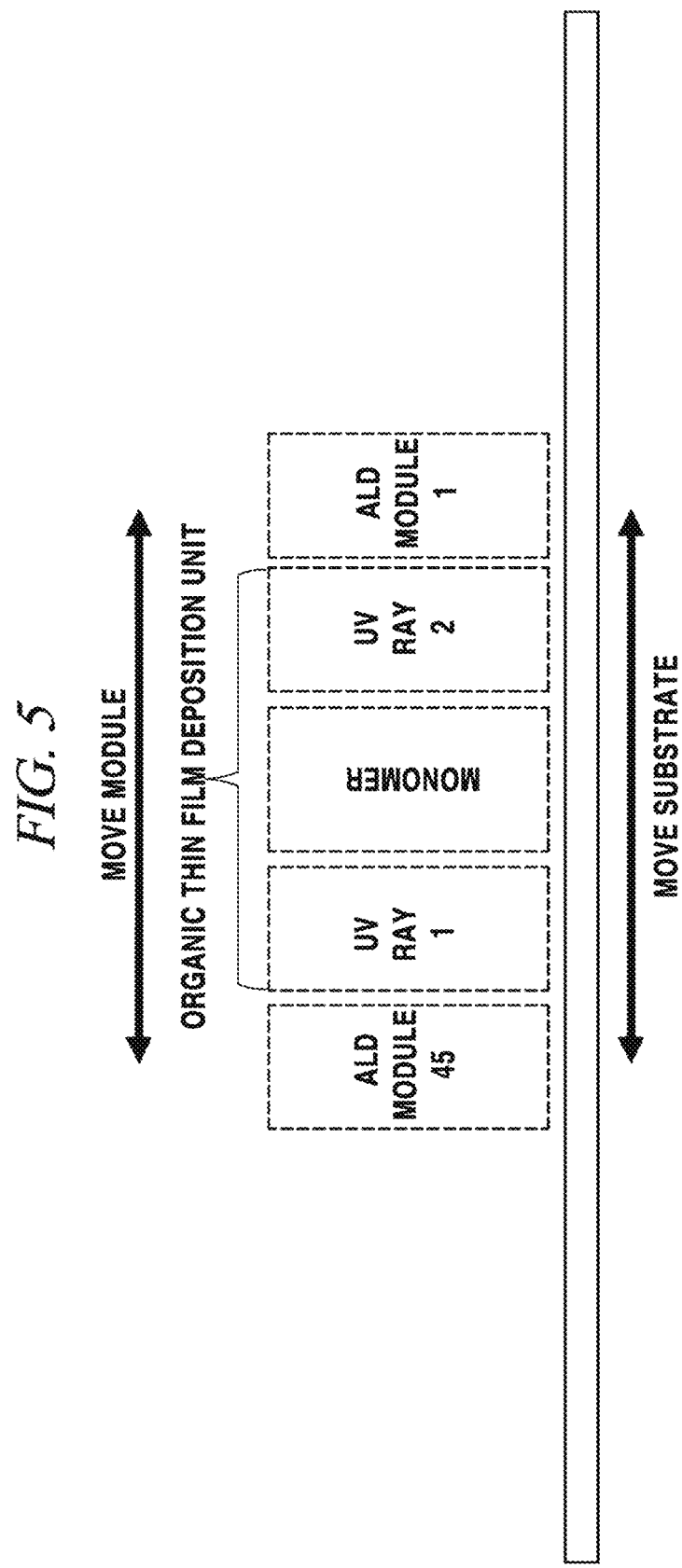
FIG. 5 is a schematic diagram illustrating an example of an apparatus for preparing a multilayer encapsulation thin-film in accordance with the present disclosure.

As depicted in FIG. 5, the organic thin film deposition unit in accordance with the present disclosure may include, but may not be limited to, UV curing units arranged on both sides of a monomer injection unit. As shown in FIG. 5 the double headed directional arrow is for the movement of the substrate in opposite directions.

Figure 6:
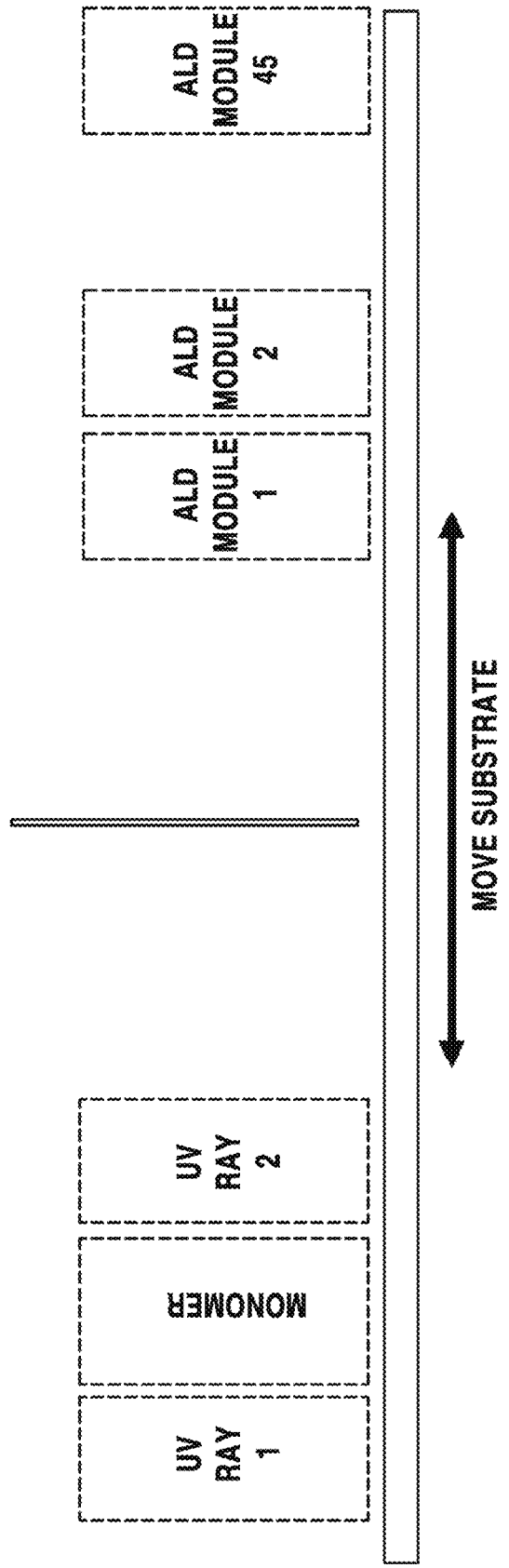
FIG. 6 is a schematic diagram illustrating an example of an apparatus for preparing a multilayer encapsulation thin-film in accordance the present disclosure.

In the apparatus for producing a multilayer encapsulation thin-film in accordance with the present disclosure, the inorganic thin film deposition unit and the organic thin film deposition unit may be alternately arranged as depicted in FIG. 5, or the organic thin film deposition unit may be positioned at first or at last as depicted in FIG. 6. The inorganic thin film deposition unit and the organic thin film deposition unit may be operated in separate spaces within the same apparatus, but the present disclosure may not be limited thereto.

Figure 7:
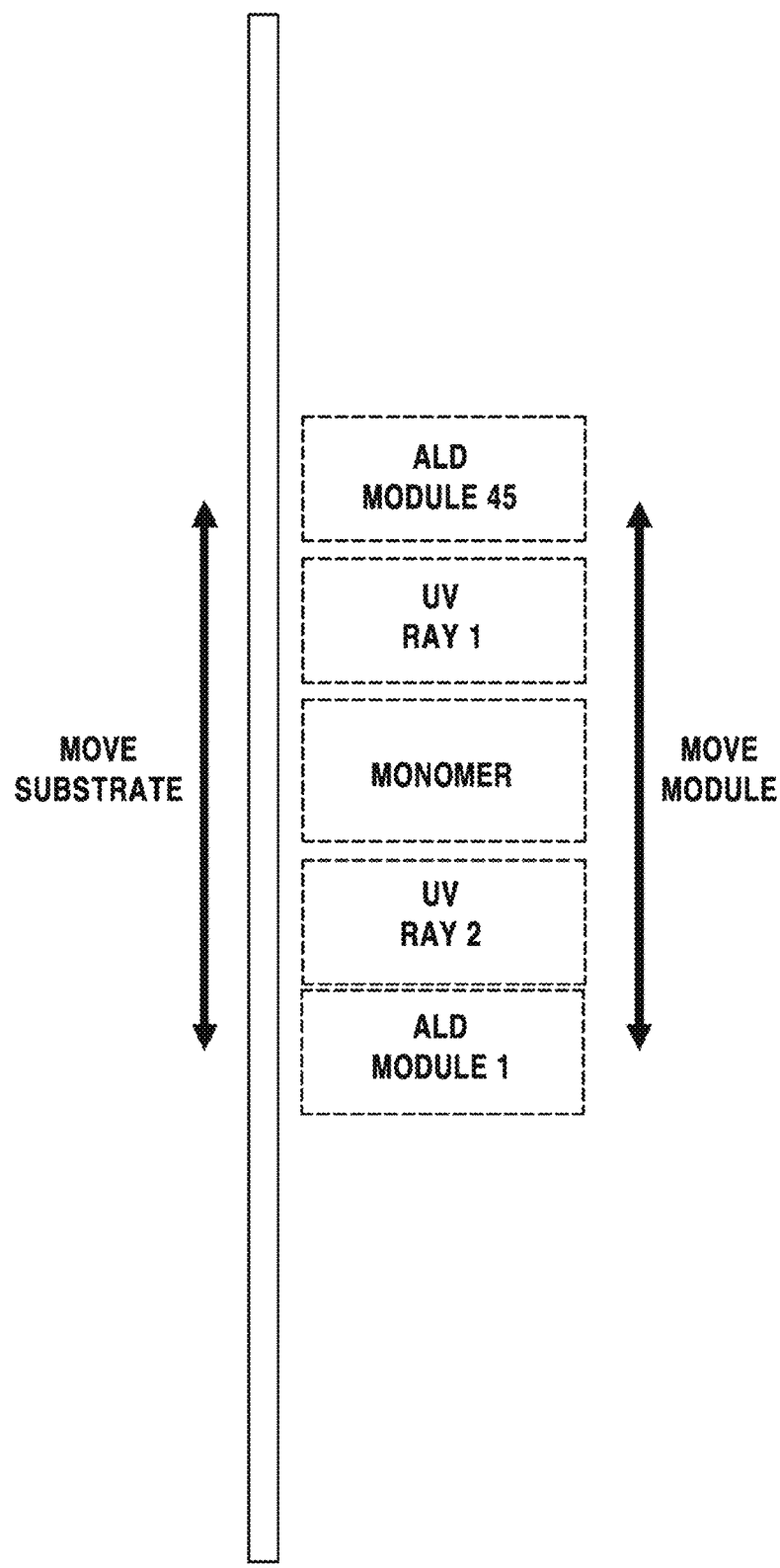
FIG. 7 is a schematic diagram illustrating an example of an apparatus for preparing a multilayer encapsulation thin-film for vertical deposition of films in accordance with the present disclosure.

If the multilayer encapsulation thin-film in accordance with the present disclosure is formed to have a large area, the multilayer encapsulation thin-film may be vertically formed as depicted in FIG. 7.

Hereinafter, examples of the present disclosure will be explained in detail. However, the present disclosure may not be limited thereto.

Example

In order to prepare a multilayer encapsulation thin-film, an aluminum oxide thin film as an inorganic material was deposited by atomic layer deposition, and a polymer thin film as an organic material was deposited using a gas-phase radical polymerization reactor using plasma. In order to prepare atomic layer deposition of the aluminum oxide thin film, trimethyl aluminum (TMA) was used as a raw material of aluminum and water was used as an oxidizer. The atomic layer deposition of the aluminum oxide thin film was carried out at about 80° C. The aluminum oxide thin film could grow to a thickness of about 0.11 nm during one reaction cycle.

In order to grow the plasma polymer, HMDSO (hexamethyl disiloxane), furan (1,4-epoxy-1,3-butadiene), or hexane was used as an organic monomer. A source material was supplied using an argon (Ar) carrier gas into plasma of about 50 W, and radicals of the source material generated within the plasma were radical-polymerized on a surface of a substrate, so that a polymer was formed. The formed plasma polymer was transparent and deposited at a speed of about 50 nm per minute.

Figure 8:
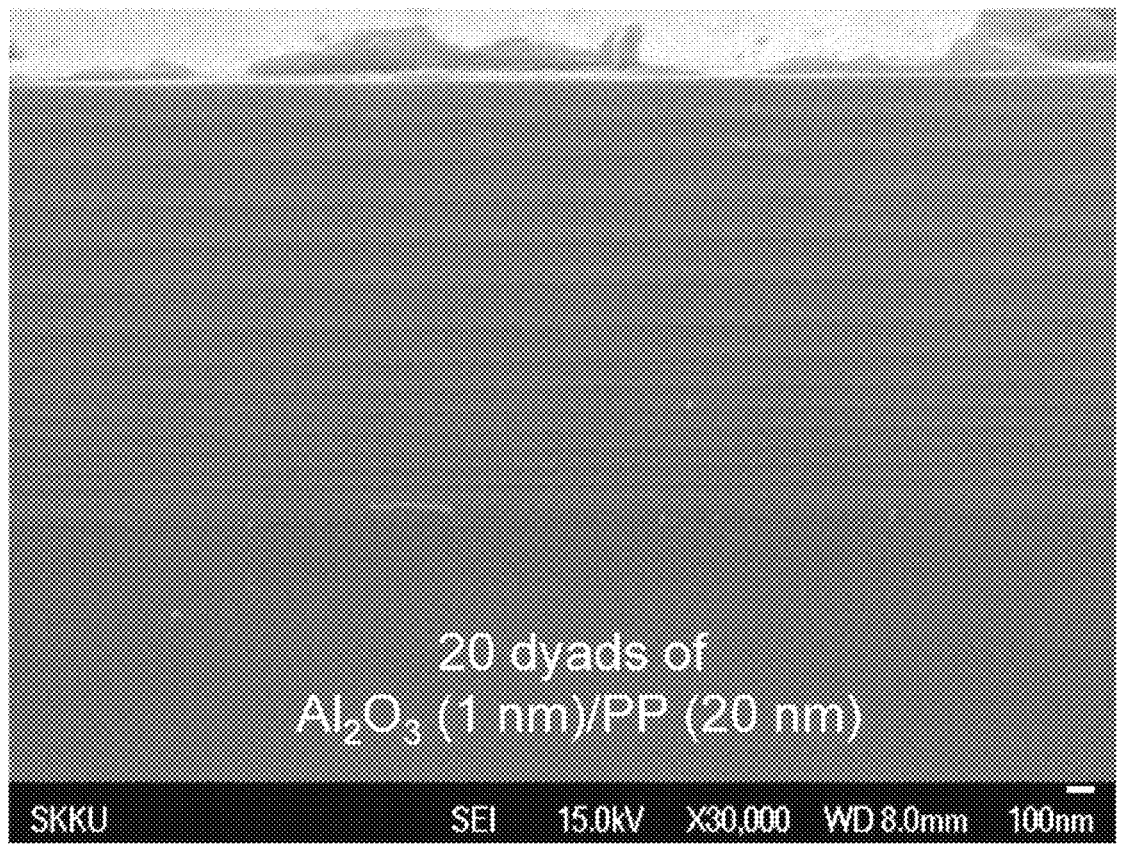
FIG. 8 is an electron micrograph of a cross section of an example of a multilayer encapsulation thin-film formed for 20 dyads in accordance with the present disclosure.
Figure 9:
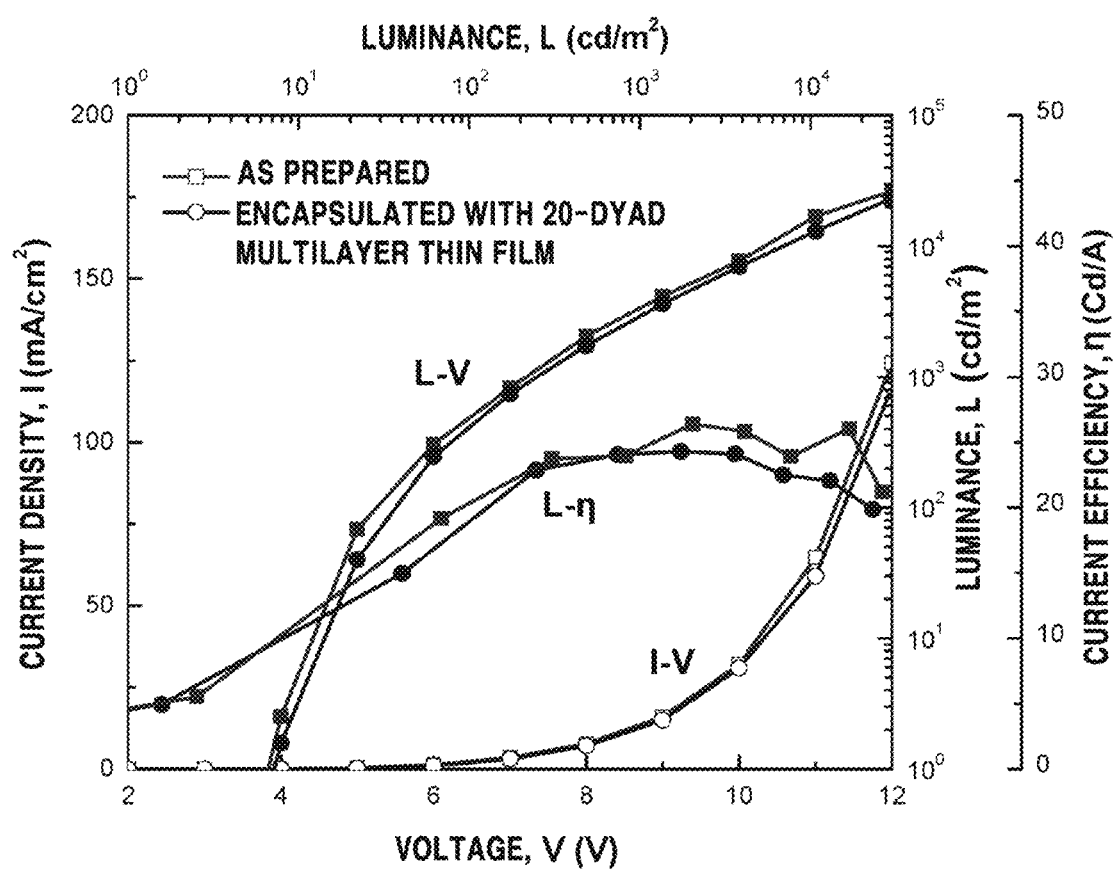
FIG. 9 is a graph showing a change in performance of an example of an organic light emitting diode before and after a multilayer encapsulation thin-film is formed in accordance with the present disclosure.
Figure 10:
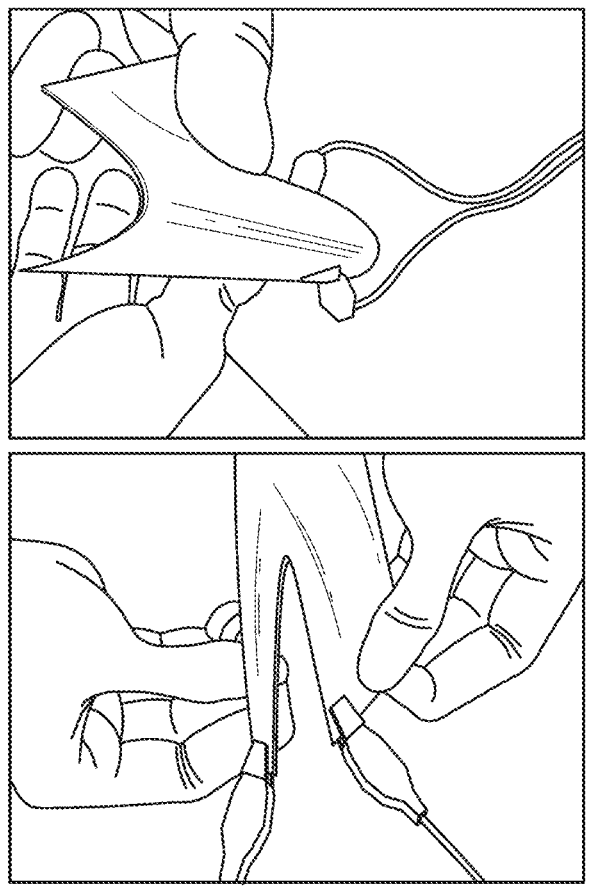
FIG. 10 is a photograph of an example of a flexible organic light emitting diode in which a multilayer encapsulation thin-film is formed in accordance with the present disclosure.

FIG. 8 provides an electron micrograph of the formed multilayer encapsulation thin-film. FIG. 8 is an electron micrograph illustrating a structure in which an aluminum oxide having a thickness of about 1 nm and a plasma polymer having a thickness of about 20 nm are stacked for 20 dyads. It was confirmed that even after a multilayer encapsulation thin-film is formed on an organic light emitting diode, there is no change in performance of the organic light emitting diode. As shown in FIG. 9, an organic light emitting diode including the multilayer encapsulation thin-film was equivalent to or superior to an organic light emitting diode before the multilayer encapsulation thin-film was formed, in terms of luminance, current density, and current efficiency. FIG. 10 is a photograph of a highly flexible organic light emitting diode including the multilayer encapsulation thin-film. It was confirmed that the organic light emitting diode including the multilayer encapsulation thin-film had a high flexibility.

Figure 11:
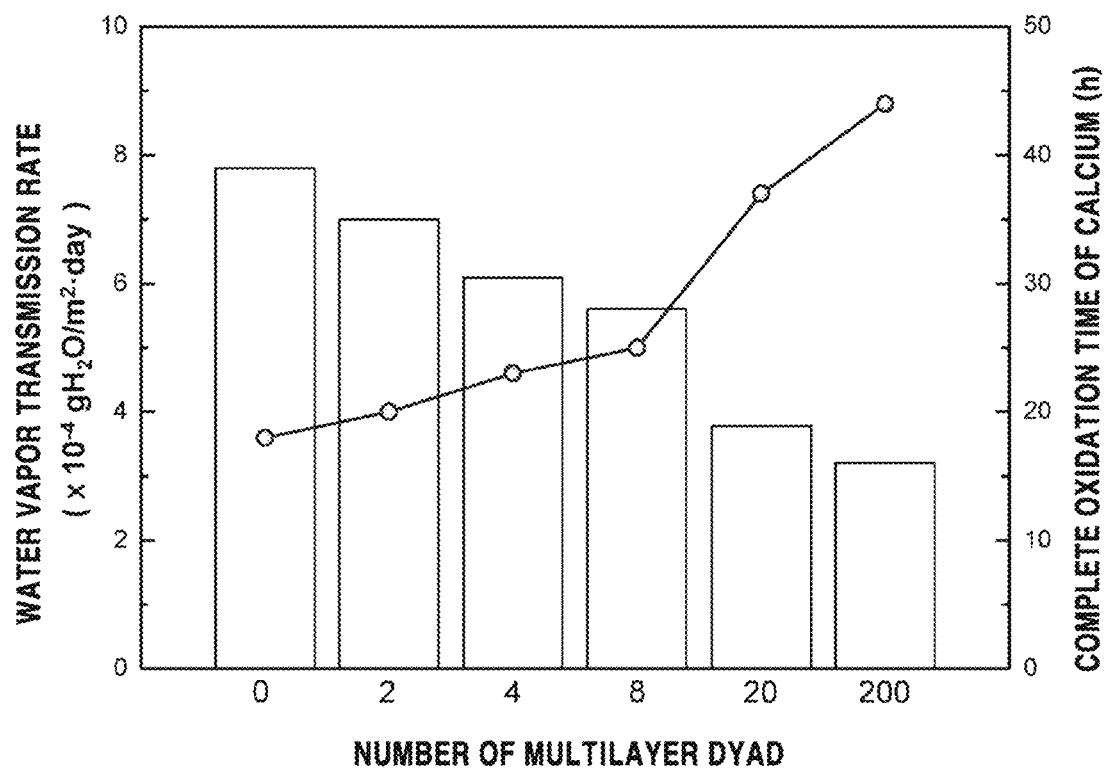
FIG. 11 is a graph showing a change in water vapor transmission rate (WVTR) depending on the number of dyads including an inorganic thin film in an example of a multilayer encapsulation thin-film in accordance with the present disclosure.

A water vapor transmission rate of the multilayer encapsulation thin-film mainly depends on a property of the inorganic thin film. An effect of suppressing transmission of water vapor of the multilayer encapsulation thin-film can be seen from a water vapor transmission rate (hereinafter, referred to as "WVTR) shown in FIG. 11. The WVTR could be obtained by measuring a time for which calcium having a certain electrical conductance is oxidized with water vapor transmitted through the multilayer encapsulation thin-film and turns to a calcium oxide without an electrical conductance.

Evaluation of Bending Property of Thin Film

Figure 12:
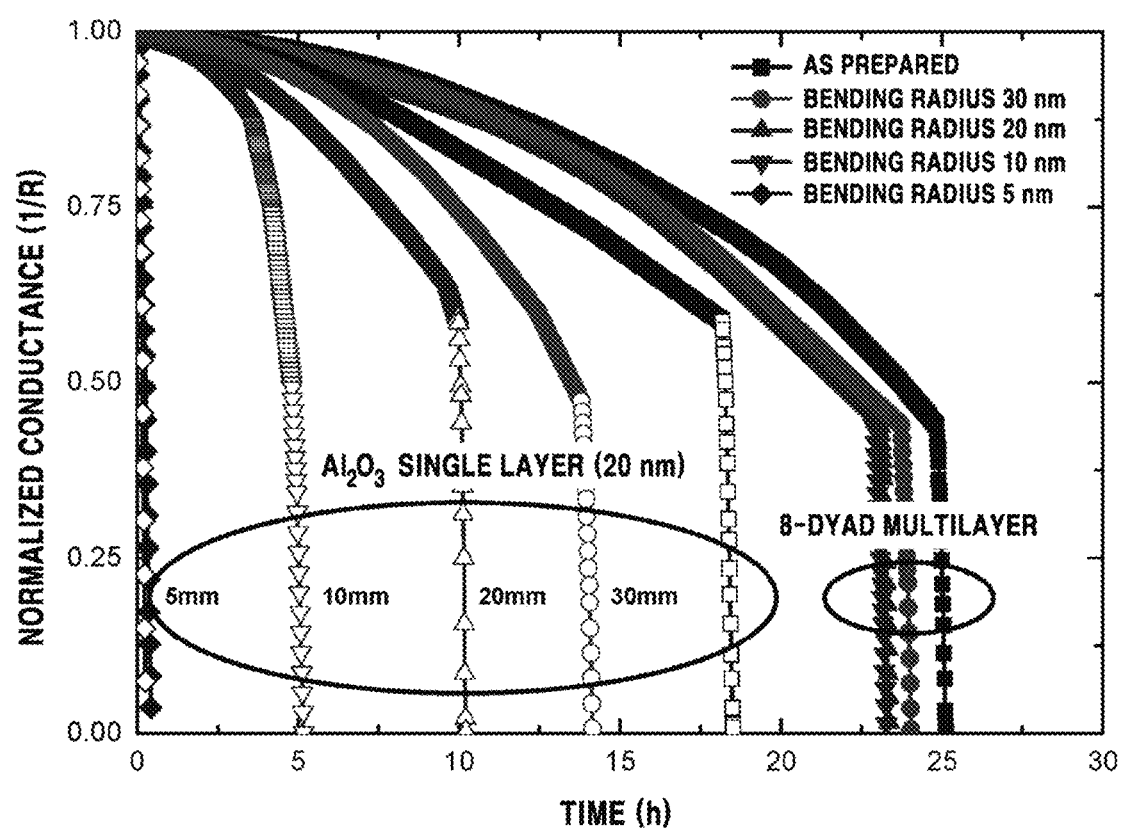
FIG. 12 is a graph comparing an inorganic thin film and an 8-dyad multilayer encapsulation thin-film in terms of a bending property in accordance with the present disclosure.
Figure 13:
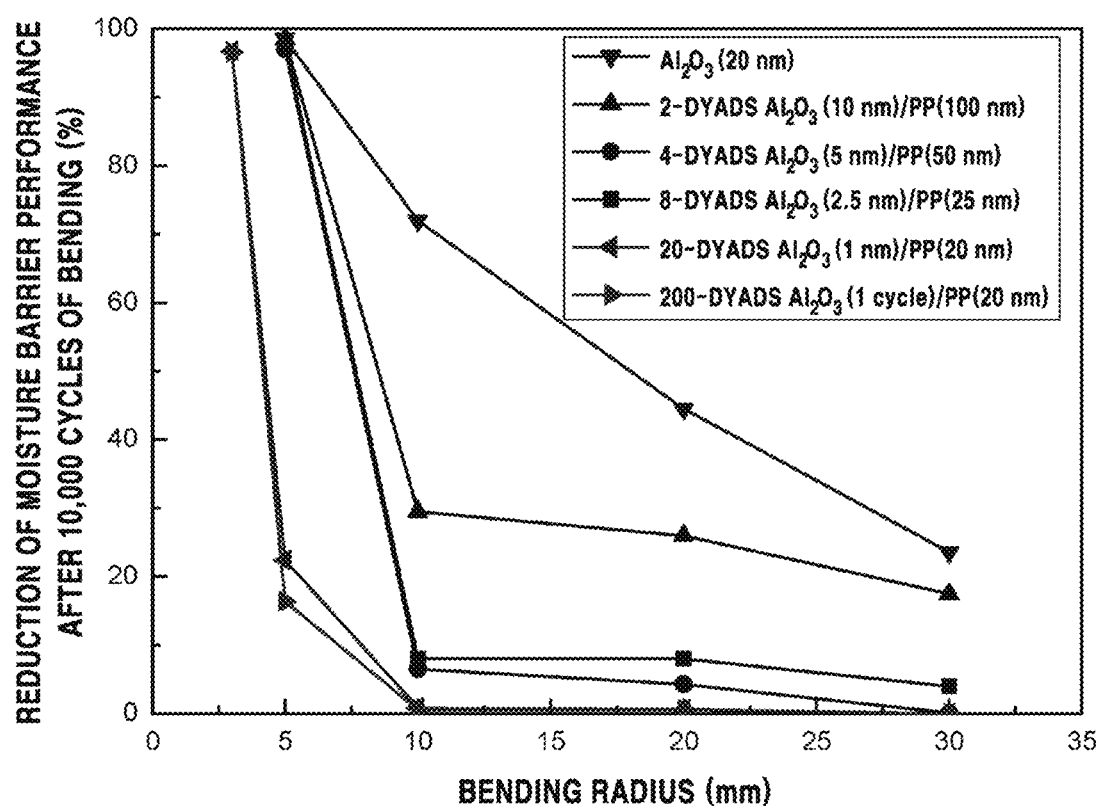
FIG. 13 is a graph comparing an inorganic thin film and multilayer encapsulation thin-films in terms of a bending property in accordance with the present disclosure.

FIG. 12 shows a result of an experiment using a calcium test before and after a bending test carried out 10,000 cycles on a single aluminum oxide thin film having a thickness of about 20 nm and an 8-dyad multilayer encapsulation thin-film with a bending radius of about 3 cm, about 2 cm, about 1 cm, and about 0.5 cm. It took about 18 hours and about 25 hours until calcium was completely oxidized in the single aluminum oxide thin film and in the 8-dyad multilayer encapsulation thin-film, respectively, before the bending test ("as prepared"). As a time increased, a property of suppressing transmission of water vapor was improved. Accordingly, as a time increased, the WVTR was reduced. In the bending test of 10,000 cycles with a bending radius of about 3 cm, it took about 14 hours until calcium was completely reduced in the single aluminum oxide thin film. However, in the multilayer encapsulation thin-film, an amount of calcium reduced was relatively very small. In the bending test with a smaller bending radius, a time tended to be remarkably reduced in the single aluminum oxide thin film, but there was almost no change in time for the multilayer encapsulation thin-films. Therefore, it was confirmed that even when the bending test was carried out 10,000 cycles with a bending radius of about 1 cm, there was almost no change in the property of suppressing transmission of water vapor. However, when the bending test was carried out with a bending radius of about 0.5 cm, both of the single aluminum oxide thin film and the multilayer encapsulation thin-film completely lost the property of suppressing transmission of water vapor. As shown in FIG. 13, in the case of 20-dyad and 200-dyad multilayer encapsulation thin-films, even when the bending test was carried out 10,000 cycles with a bending radius of about 0.5 cm, a water vapor transmission reduction rate was about 20%. Therefore, it could be seen that they still had the property of suppressing transmission of water vapor.

Figure 14:
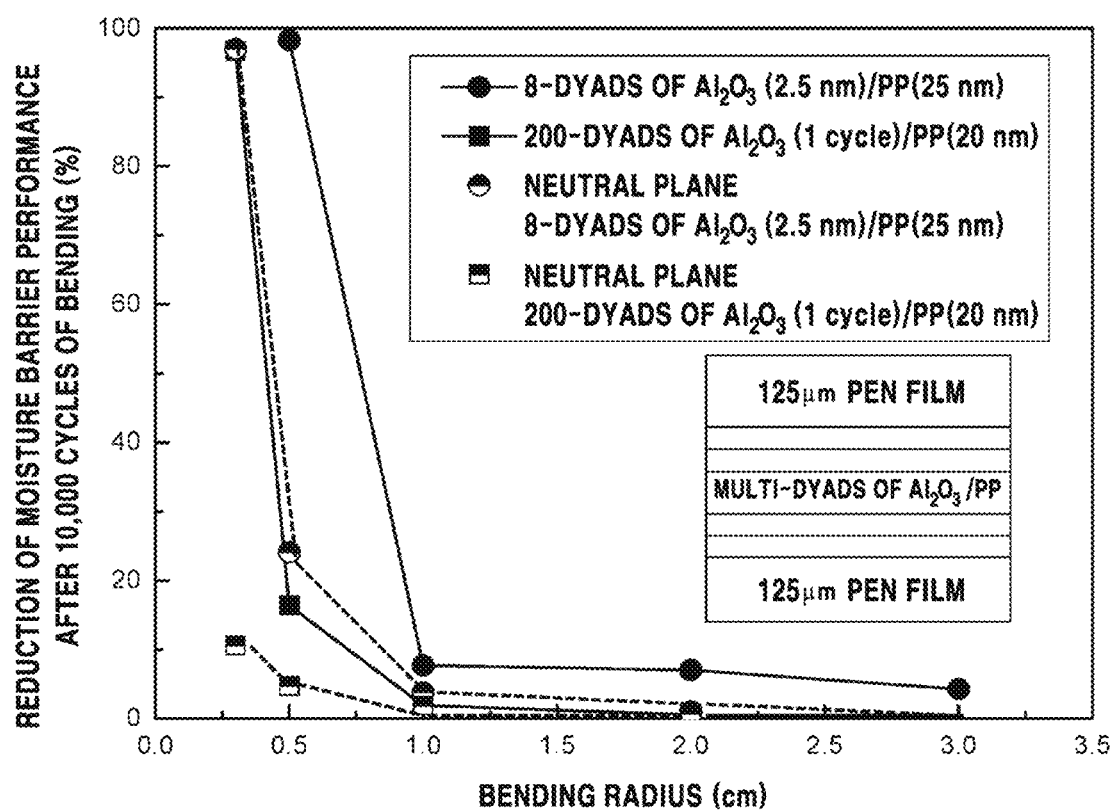
FIG. 14 is a graph showing an improvement in a bending property at neutral planes of an 8-dyad multilayer encapsulation thin-film and a 200-dyad multilayer encapsulation thin-film in accordance with the present disclosure.

FIG. 14 is a graph showing a bending property at neutral planes of an 8-dyad multilayer encapsulation thin-film and a 200-dyad multilayer encapsulation thin-film. The same material (polyethylene naphthalate [PEN]) was used for upper and lower parts of a multilayer thin film, so that a multilayer encapsulation thin-film can be positioned at a neutral plane. As shown in FIG. 14, when the multilayer encapsulation thin-film was positioned at a neutral plane, it was improved in a bending property as compared with a multilayer encapsulation thin-film which was not. This may be because a multilayer encapsulation thin-film which is positioned at a neutral plane is not applied with a tensile force and/or a compressive force as compared with multilayer encapsulation thin-film which is not, and, thus, appearance of cracks can be suppressed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of preparing a multilayer encapsulation thin-film, the method comprising:
   forming an inorganic thin film comprising a metal oxide on a substrate; and
   forming an organic thin film comprising a polymer on the inorganic thin film using an organic thin film deposition unit comprising a monomer injection unit and UV-curing units,
   wherein the forming of the inorganic thin film and the forming of the organic thin film are alternately carried out, so that separate inorganic thin film and organic thin film are alternately stacked on top of each other,
   wherein the forming of each organic thin film in the alternate stack comprises:
   coating an acrylic monomer on each inorganic thin film; and
   UV-curing the coated acrylic monomer using a first UV-curing unit when the substrate is moving in one direction and a second UV-curing unit when the substrate is moving in the opposite direction, and
   wherein the first and second UV-curing units are disposed one adjacent each side of both sides of the monomer injection unit.

2. The method of claim 1, wherein the forming of each inorganic thin film in the alternate stack is carried out by an atomic layer deposition (ALD) module, and wherein the organic thin film deposition unit is disposed between two ALD modules to alternately form the inorganic thin film and the organic thin film on top of each other while reciprocating the substrate.

3. The method of claim 1, wherein the inorganic thin film comprises an aluminum oxide thin film.

4. The method of claim 1, wherein the metal oxide comprises a member selected from the group consisting of aluminum oxide, zirconium oxide, zinc oxide, and combinations thereof.

5. The method claim 1, wherein the forming of the inorganic thin film and/or the forming of the organic thin film are carried out at a temperature in a range of about 20° C. to about 120° C.

6. The method of claim 1, wherein the forming of each inorganic thin film in the alternate stack is carried out by a spatial atomic layer deposition comprising spatially arranging raw materials for the inorganic thin film on a moving substrate.

7. A method of preparing a multilayer encapsulation thin-film, the method comprising:
   forming an inorganic thin film on a substrate using a spatial atomic layer deposition (spatial ALD) module comprising spatially arranging raw materials for the inorganic thin film on the substrate; and
   forming an organic thin film on the inorganic thin film using an organic thin film deposition unit comprising a monomer injection unit and UV-curing units,
   wherein the forming of the inorganic thin film and the forming of the organic thin film are alternately carried out, so that separate inorganic thin film and organic thin film are alternately stacked on top of each other,
   wherein the forming of each organic thin film in the alternate stack comprises:
   coating an acrylic monomer on each inorganic thin film; and
   UV-curing the coated acrylic monomer using a first UV-curing unit when the substrate is moving in one direction and a second UV-curing unit when the substrate is moving in the opposite direction, and
   wherein the first and second UV-curing units are disposed one adjacent each side of both sides of the monomer injection unit.

* * * * *